United States Patent [19]
Fieramosca et al.

[11] Patent Number: 5,950,149
[45] Date of Patent: Sep. 7, 1999

[54] METHOD FOR TESTING VEHICLE ELECTRICAL SYSTEM DURING MANUFACTURING

[75] Inventors: Michael Fieramosca, North Andover, Mass.; Michael Hall, Huntsville, Mich.

[73] Assignee: Chrysler Corporation, Auburn Hills, Mich.

[21] Appl. No.: 08/884,610

[22] Filed: Jun. 30, 1997

[51] Int. Cl.[6] .............................. G01R 3/00; G01R 31/01
[52] U.S. Cl. .......................... 702/183; 702/59; 702/185; 324/503; 701/29; 701/32; 340/653; 340/539
[58] Field of Search ................................ 702/59, 58, 57, 702/182, 183, 185; 324/500, 503; 701/29, 32, 31, 33; 73/116; 340/653, 539, 825.3, 825.31, 825.34

[56] References Cited

U.S. PATENT DOCUMENTS

| | | | |
|---|---|---|---|
| 4,404,639 | 9/1983 | McGuire et al. | 364/551 |
| 4,738,133 | 4/1988 | Breckel et al. | 73/117.3 |
| 5,077,674 | 12/1991 | Tischler et al. | 364/468 |
| 5,321,439 | 6/1994 | Rogers | 348/135 |
| 5,521,958 | 5/1996 | Selig et al. | 379/21 |
| 5,541,840 | 7/1996 | Gurne et al. | 364/424.03 |
| 5,574,226 | 11/1996 | Reuther et al. | 73/669 |
| 5,671,158 | 9/1997 | Fournier et al. | 364/514 R |

FOREIGN PATENT DOCUMENTS

0754940A2  1/1997  European Pat. Off. ....... G01M 15/00

OTHER PUBLICATIONS

Intelligent Barcode Systems IBS–800RF Radio Frequency Portable Terminal Ad. at http://www.barcodesystems.com/IBS–800RF.htm, Mar. 30, 1997.

*Primary Examiner*—Patrick Assouad

[57] ABSTRACT

A system for testing the electrical components of vehicles during manufacturing includes a hand held tester to which a translator unit can be detachably engaged and with which the tester is in RF communication. The translator unit can be detached from the tester and plugged into a test receptacle under a vehicle's dashboard to communicate with the vehicle by translating computer formatted data from the tester to vehicle bus-formatted data, and vice-versa. Then, the vehicle's VIN is scanned into the tester or manually input into the tester, and the tester transmits the VIN via an RF link in the assembly plant to a computer in the plant. Based on the VIN, the computer determines the electric equipment that the vehicle has, and the computer transmits this information back to the tester. The tester then determines which tests to execute, and the tester causes the translator unit to undertake these tests. The translator transmits the test results back to the tester which in turn transmits the results to the computer. A portable current module can be provided that monitors the current drawn from the vehicle's battery during the testing and for communicating this data to the tester via RF link.

24 Claims, 4 Drawing Sheets

METHOD FOR TESTING VEHICLE ELECTRICAL SYSTEM DURING MANUFACTURING

FIELD OF INVENTION

The present invention relates generally to vehicle test systems, and more particularly to systems and methods for testing electrical systems of vehicles during manufacturing.

BACKGROUND OF THE INVENTION

During vehicle manufacturing, it is necessary to conduct various tests of the newly made vehicles to ensure that the vehicles operate satisfactorily. Among the quality assurance tests conducted during vehicle manufacturing is testing of the vehicle's electrical system, after it has been installed in the vehicle.

In existing vehicle assembly plants, electrical testing is conducted at an electrical test segment of the assembly line that is dedicated solely to the electrical testing. As vehicles are transported on the assembly line through the electrical testing segment, large, monument-like electrical test consoles are moved along with the vehicles on a trolley that is parallel to the assembly line. Each console is connected to a cable, and the cable terminates in a plug that a test technician can engage with a test socket underneath a vehicle's dashboard. Once a console has been connected to a vehicle via the cable, the console executes a series of tests of the vehicle's electrical system as the trolley moves the console along the assembly line with the vehicle.

While effective for its intended purpose, the above-described system requires a portion of the assembly line be dedicated to electrical testing. This consumes space in the assembly plant that could otherwise be used for other purposes. Also, the above-described system requires large test consoles and accompanying trolleys to move the consoles, which are expensive. Further, the cables that connect the consoles to the vehicles can cause interference with nearby equipment and people.

Additionally, if a vehicle fails a test, the vehicle must be taken off the assembly line, repaired, and retested. To retest the vehicle, it must be placed back on the assembly line and transported to the electrical test segment of the line, which is time consuming. In other words, the throughput of the assembly plant is reduced each time a vehicle requires retesting.

Moreover, it might happen that vehicles which have been tested and then moved out of the assembly building require modification or repair, in which case all of the affected vehicles must be moved back into the building, onto the assembly line, and then retested at the electrical test segment of the line. Such an event can severely reduce the throughput of the assembly plant.

The present invention recognizes the above cost, space, and throughput drawbacks of existing electrical test systems. Fortunately, the present invention further recognizes that it is possible to alleviate these problems using the inventive structures and methods disclosed herein.

In addition to the above considerations, the present invention recognizes that certain other advances can be made in vehicle electrical testing. In particular, the present invention recognizes that it would be advantageous to monitor the current flow from a vehicle's battery as, e.g., the electrically-powered window motors of the vehicle are being tested, to determine whether a window is encountering mechanical interference with another vehicle component such as the door trim surrounding the window. Still further, the present invention recognizes that electrical test setpoints are currently hard-wired and consequently cannot be easily changed by technicians at the assembly plant, and that this reduces the flexibility and maintainability of the test system.

And, prototypes of a vehicle's electrical system, colloquially referred to as "wiring bucks", cannot easily be tested using the same test system that is used to test manufactured vehicles on an assembly line. This is unfortunate, because deficiencies in a vehicle model's electrical system might be discovered more easily, and the test protocol for a model be validated more efficiently, if the wiring buck of a vehicle model could be tested using the same test system that is to be used on production vehicles.

Accordingly, it is an object of the present invention to provide an electrical test system for vehicle manufacturing quality assurance.

Another object of the present invention is to provide an electrical test system for vehicle manufacturing quality assurance that uses portable components.

Still another object of the present invention is to provide an electrical test system for vehicle manufacturing quality assurance that can be used anywhere in a vehicle assembly plant.

Yet another object of the present invention is to provide an electrical test system for vehicle manufacturing quality assurance that measures the electric current flow of a vehicle battery during electrical testing, to provide a further diagnostic indicator of the vehicle's electrical system.

Another object of the present invention is to provide an electrical test system for vehicle manufacturing quality assurance that can be used on a wiring buck.

Yet another object of the present invention is to provide an electrical test system for vehicle manufacturing quality assurance that permits test setpoints to be changed using software at an assembly plant.

Still another object of the present invention is to provide an electrical test system for vehicle manufacturing quality assurance that is easy to use and cost-effective.

SUMMARY OF THE INVENTION

A method for testing an electrical system of a vehicle at a vehicle assembly plant includes transmitting, via radiofrequency (RF) link, vehicle information to a portable tester. Then, the electrical system is tested in accordance with the vehicle information.

In a preferred embodiment, the vehicle information is salescode information, and the method further includes transmitting, at the portable tester, a vehicle identification number (VIN) that is associated with the vehicle to cause the transmitting of the salescode data in response. Preferably, the VIN is input by scanning the VIN into the tester.

As described in greater detail following, the method also includes correlating the salescode data to test protocols at the tester. Moreover, the method can include engaging a translator with a test receptacle of the electrical system, and establishing communication between the translator and the tester. Still further, the present method contemplates establishing communication between the translator and the tester by an RF link.

In accordance with the preferred embodiment of the present invention, the method includes the step of establishing communication between the tester and the electrical system only when the tester transmits a predetermined key code to the electrical system. If desired, the method can include monitoring the current from the battery of the vehicle during testing, as well as monitoring the voltage of the electrical system during testing.

In another aspect of the present invention, a method for testing electrical components of a vehicle during assembly of the vehicle or thereafter in substantially any location within or immediately adjacent to a vehicle assembly plant includes obtaining a VIN that is associated with the vehicle by scanning the VIN using a bar code reader. Then, the method transmits the VIN via a primary RF link to a computer, and in response to receiving the VIN, transmits salescode data. This data is correlated to a test protocol, which is executed to test the electrical components of the vehicle.

In still another aspect, a method is disclosed for testing an electrical system of a vehicle during assembly of the vehicle or thereafter in substantially any location within or immediately adjacent to a vehicle assembly plant. The present method includes transmitting, at a portable tester, a vehicle identification number (VIN) associated with the vehicle. Salescode data is then transmitted, via radiofrequency (RF) link, to the tester in response to the VIN, and the salescode data is correlated to test protocols at the tester. The electrical system is then tested in accordance with the test protocols.

The details of the present invention, both as to its structure and operation, can best be understood in reference to the accompanying drawings, in which like reference numerals refer to like parts, and in which:

DETAILED DESCRIPTION OF THE PREFERRED EMBODIMENT

Figure 1:
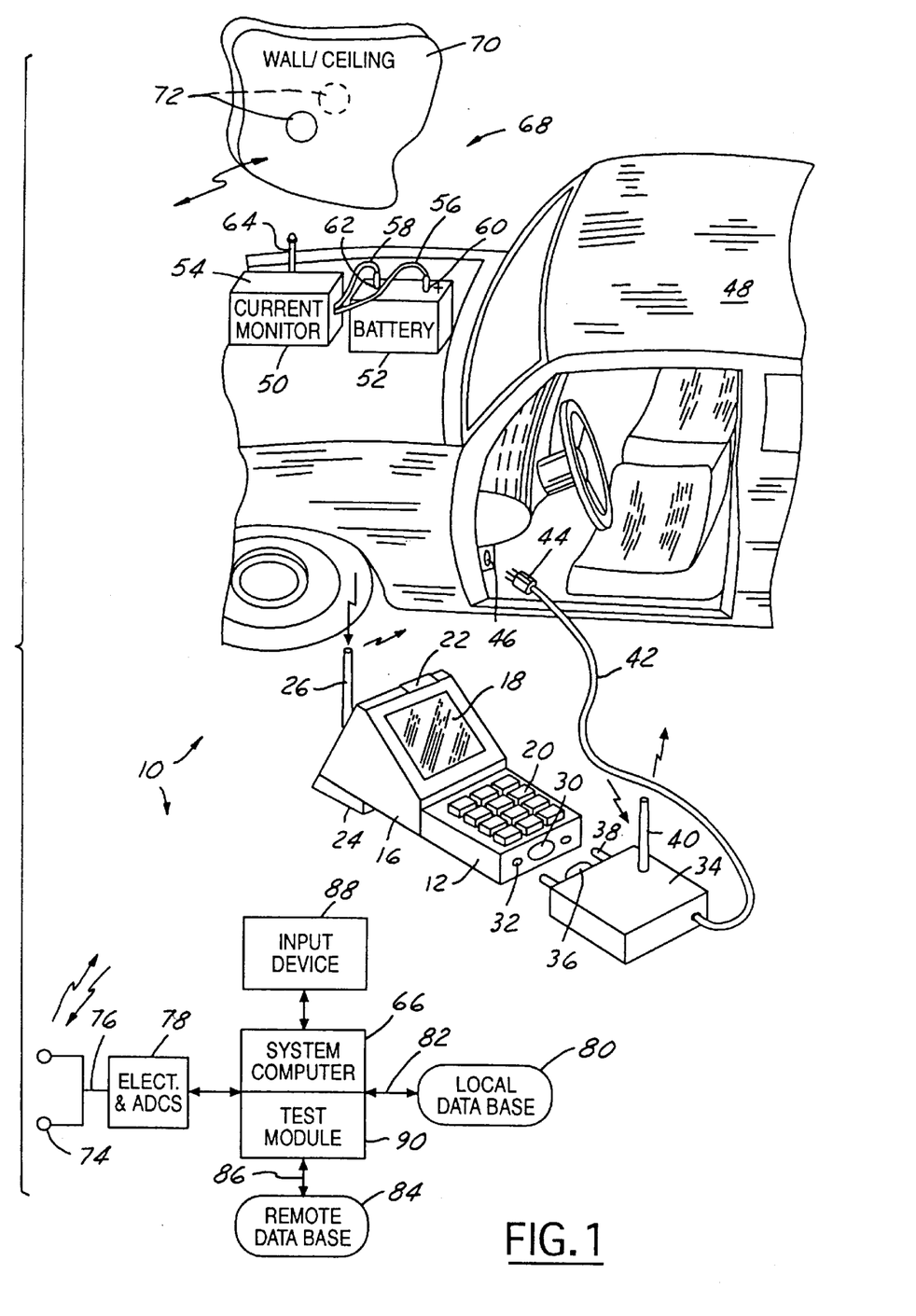
FIG. 1 is a perspective view of the electrical test system, showing portions of the communication system and computer system schematically.

Referring initially to FIG. 1, a vehicle electrical test system is shown, generally designated 10, which includes one or more portable, hand-holdable testers 12 and one or more portable, hand-holdable translators 14 (only one tester 12 and one translator 14 shown in FIG. 1 for clarity). As shown, the tester 12 includes a hollow, rigid, lightweight plastic or metal tester housing 16. As more fully disclosed below, a microprocessor (not shown in FIG. 1) is supported in the tester housing 16, and the microprocessor presents data on a flat panel display 18. Data can be input to the microprocessor by means of a keypad or keyboard 20.

Additionally, bar-coded data can be entered into the microprocessor that is within the tester housing 16 by scanning the data into a bar code reader 22, on the tester housing 16. A direct current, preferable rechargeable secondary battery 24 is also mounted on the tester housing 16 and is electrically connected to the electrical components inside the housing 16 as more fully described below. Furthermore, a radiofrequency (RF) tester antenna 26 is mounted on the housing 16 for purposes to be shortly disclosed. In the presently preferred embodiment, the tester 12 is a microprocessor based device marketed under the trade name Telxon by Dynetics, Inc. of Huntsville, Ala.

FIG. 1 shows that the tester 12 includes a data plug 30 and two engagement receptacles 32. The translator 14 includes a lightweight hollow rigid plastic or metal translator housing 34, and a data connector 36 and two engagement posts 38 protrude outwardly therefrom for closely engaging the data plug 30 and engagement receptacles 32 of the tester 12 in respective interference fits. In this way, the translator 14 can be easily engaged with the tester 12 by pushing the posts 38 into the receptacles 32, and then easily disengaged from the tester 12 by pulling the translator 14 away from the tester 12, without the need for tools. Further, when the translator 14 is engaged with the tester 12, data and power can be exchanged between the two via the data connector 36 and data plug 30. Alternatively, the translator 14 includes a direct current battery and a translator antenna 40, and data is exchanged between the tester 12 and translator 14 via the tester and translator antennae 26, 40, as described in detail below.

A cable 42 is connected to electrical components inside the translator housing 34, and the cable 42 terminates in a test plug 44. As shown, the test plug 44 is configured for engaging a test receptacle 46 in a vehicle 48 having an electrical system that is to be tested. It is to be understood that the test receptacle is in electrical communication with the electrical system of the vehicle 48.

In addition to communicating with the translator 14 and, hence, with the electrical system of the vehicle 48, the tester 12 can communicate via RF with an associated current monitor 50 for monitoring the discharge current of the battery 52 of the vehicle 48 during testing. In the embodiment shown, the current monitor 50 includes a hollow rigid lightweight plastic or metal monitor housing 54, and positive and negative leads 56, 58 extend outwardly from the monitor housing 54. As more fully disclosed below, the leads 56, 58 are electrically connected to current sensing components in the monitor housing 54. Also, each lead 56, 58 terminates in a respective metal battery post clip 60, 62. The clips 60, 62 are configured for engaging the positive and negative terminals, respectively, of the battery 52. In one preferred embodiment, the clips 60, 62 are conventional jumper cable clips.

To facilitate communication between the tester 12 and the current monitor 50, a monitor antenna 64 protrudes from the monitor housing 54. As more fully disclosed below, the monitor antenna 64 is electrically connected to RF transceiving components within the monitor housing 54.

In accordance with the present invention, a system computer 66 is in wireless communication with the tester 12 for receiving communications, including queries in the form of vehicle identification numbers (VIN), and for transmitting vehicle salescode data to the tester 12 in response to receiving the VIN. This salescode data contains information regarding the specific electrical components in a particular vehicle, as identified by the VIN of the vehicle. In response to receiving the salescode data, the tester 12 generates test protocols which are translated into vehicle bus format by the translator 14. It is to be understood that the system computer 66 is a personal computer, mini-computer, or mainframe computer.

To facilitate the above-mentioned wireless communication, a wireless, preferably radiofrequency (RF) communication system is provided in a vehicle assembly plant, generally designated 68, at which the vehicle 48 to be tested is assembled. The preferred communication system has a data throughput of at least two million bytes per second (2 mBps).

The plant 68 includes structural surfaces 70, such as walls, ceiling, girders, and the like, both load bearing and non-load bearing, and plural RF repeater transceivers 72 are mounted on the surfaces 70. FIG. 1 shows one repeater transceiver 72 in phantom and one in solid, indicating that the repeater transceivers 72 can be mounted on interior surfaces of the plant 68 and on exterior surfaces of the plant 68 to facilitate communication with a tester 12 substantially everywhere the tester 12 (and vehicle 48) is located inside the plant 68 or in an outdoor parking area immediately adjacent the plant 68.

Accordingly, the skilled artisan will appreciate that the tester 12 can communicate with the repeater transceivers 72. In turn, the repeater transceivers 72 communicate via RF with one or more central transceivers 74. When the tester 12 is close to the central transceivers 74, the tester 12 can communicate directly with the central transceivers 74. In any case, signals received by the central transceivers 74 are sent via an optical fiber eight million bytes per second (8 mBps) ethernet 76 to conventional amplifying and digitizing circuitry 78, and thence to the system computer 66. Those skilled in the art will appreciate that the circuitry 78 includes digital to analog converters (DAC) for converting signals from the computer 66 to analog format. Also, the circuitry 78 includes analog to digital converters (ADC) for converting signals from the central transceivers 74 to digital format. In one preferred embodiment, the RF transceiver system described above is made by Aeronet Corp. of Akron, Ohio, and the system operates at between than one gigaHertz and five gigaHertz (1 gHz–5 gHz), and preferably at two and four tenths gigaHertz (2.4 gHz).

FIG. 1 schematically illustrates that the system computer 66 in the plant 68 can 140 access a local database 80 that contains salescode and VIN data, using a local area network (LAN) 82. Moreover, the system computer 66 can access, via a wide area network 86, a remote database 84 also containing VIN and salescode data. Data can be input to the system computer 66 by means of an appropriate input device 88, such as a computer keyboard, keypad, mouse, trackball, touchscreen, or voice activated device.

Figure 5:
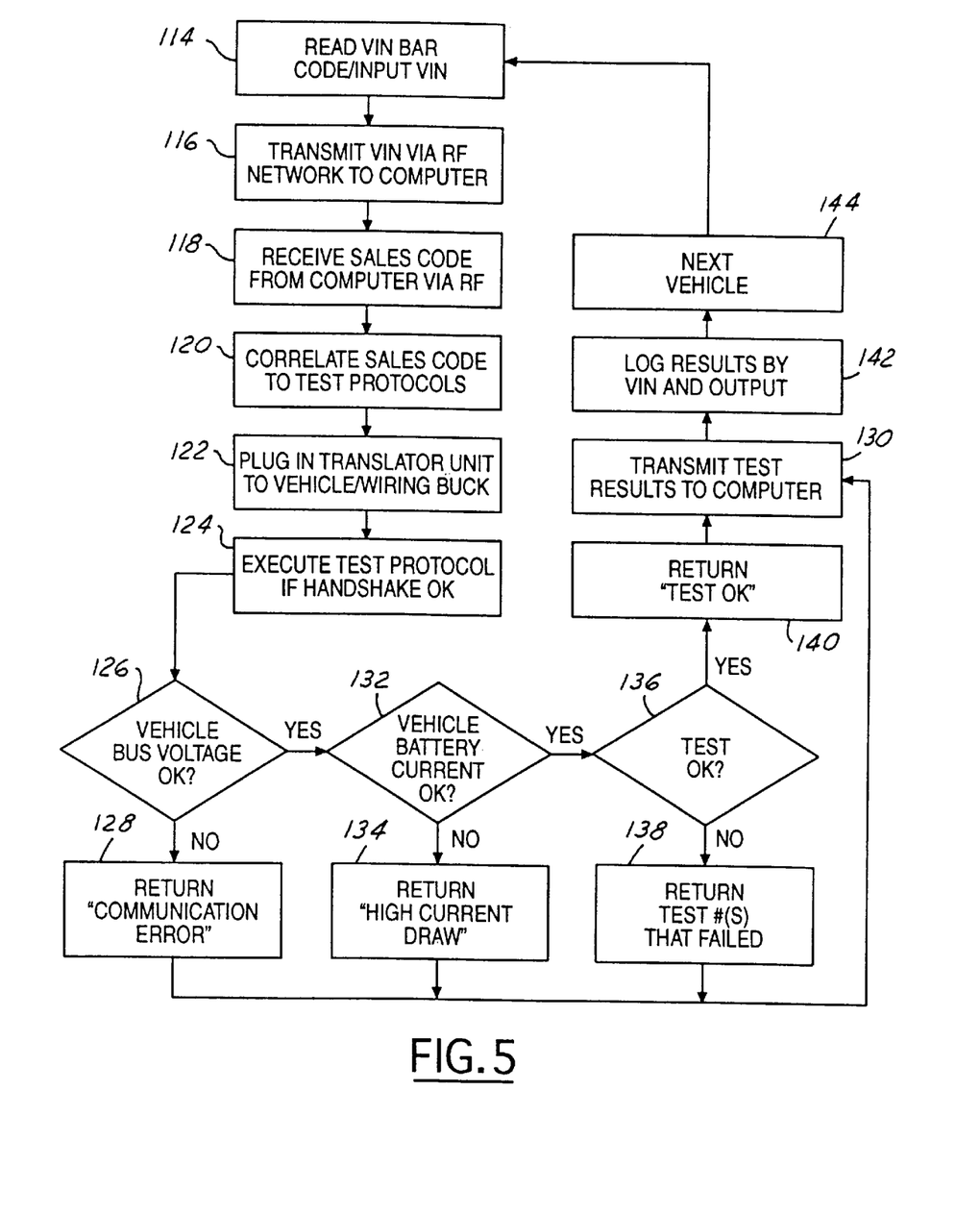
FIG. 5 is a flow chart of the overall method steps for testing a vehicle wiring buck and a vehicle.
Figure 6:
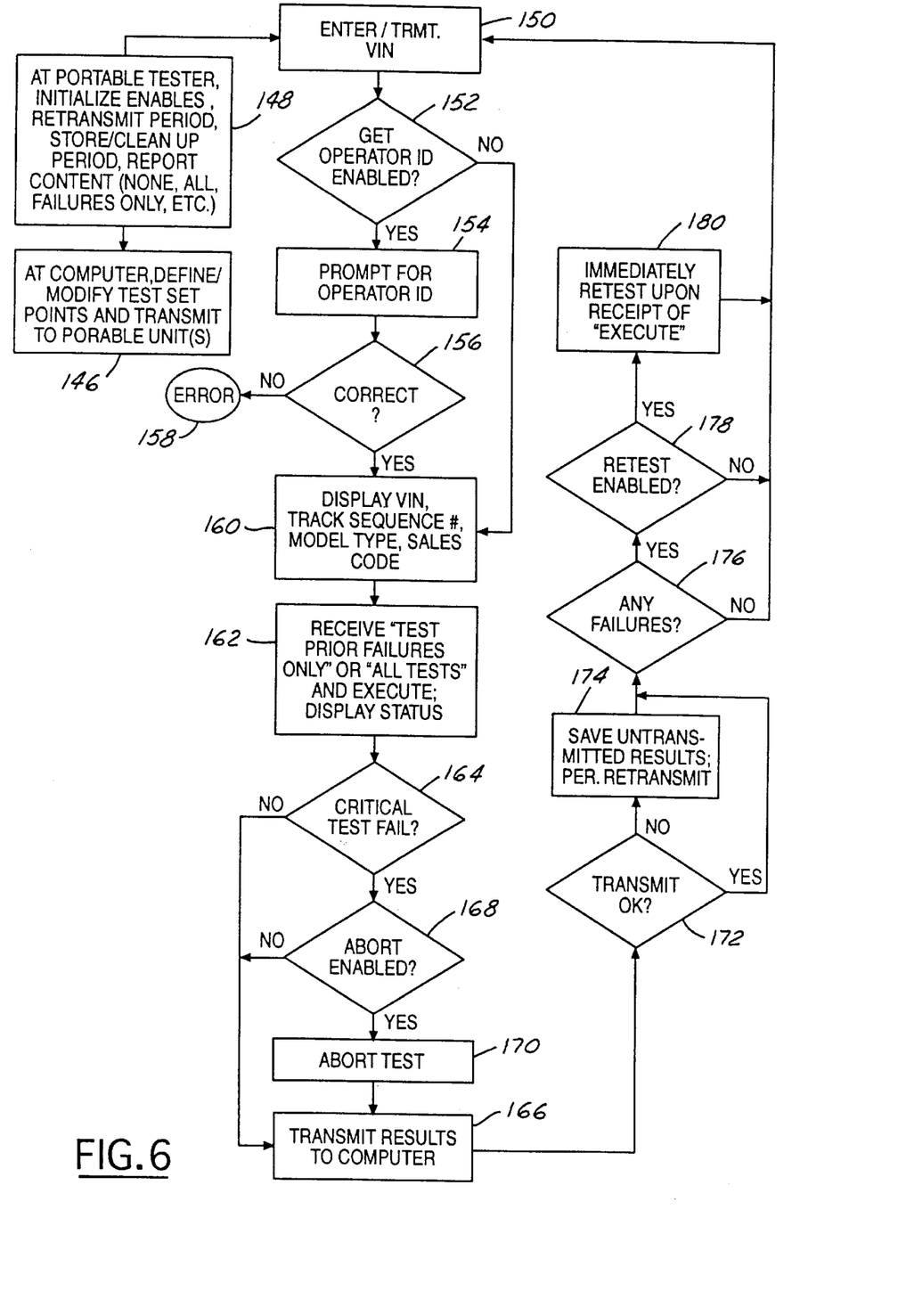
FIG. 6 is a flow chart showing details of computer-implemented portions of the testing method of the present invention.

A software-implemented test module 90 is accessible by the system computer 66. It is to be understood that the tester microprocessor disclosed below accesses a complementary test module (not shown in FIG. 1). Portions of FIGS. 5 and 6 show the logic of the test module 90. It is to be understood that the test modules of the present invention are implemented on device media. In one embodiment, the operations of the present test modules described below in reference to FIGS. 5 and 6 are embodied in a device medium such as software, i.e., in machine-readable form and stored on a computer program storage device. In other words, portions of FIGS. 5 and 6 illustrate the structures of the test modules of the present invention as might be embodied in computer program software or in logic circuits. Those skilled in the art will appreciate that portions of FIGS. 5 and 6 illustrate the structures of computer program code elements that function according to this invention. Manifestly, the invention is practiced in its essential embodiment by a machine component that renders the computer program code elements in a form that instructs a digital processing apparatus (that is, a computer) to perform a sequence of function steps corresponding to those shown in the Figures.

When embodied in software, these instructions may reside on a program storage device including a data storage medium, such as can be found on a computer floppy diskette, on semiconductor devices, on magnetic tape, on optical disks, on a DASD array, on a conventional hard disk drive, on electronic read-only memory or on electronic random access memory, or other appropriate data storage device. In an illustrative embodiment of the invention, the computer-executable instructions may be lines of compiled C language code and C++ language code. In any case, apart from the particular computer program storage device (i.e., firmware logic circuits or software) that embodies the test modules, as intended by the present invention, the test modules, including the test module 90 shown in FIG. 1, establish program means which embody logic means that are recognizable by the system computer 66 and tester microprocessor to perform the method steps disclosed below.

Figure 2:
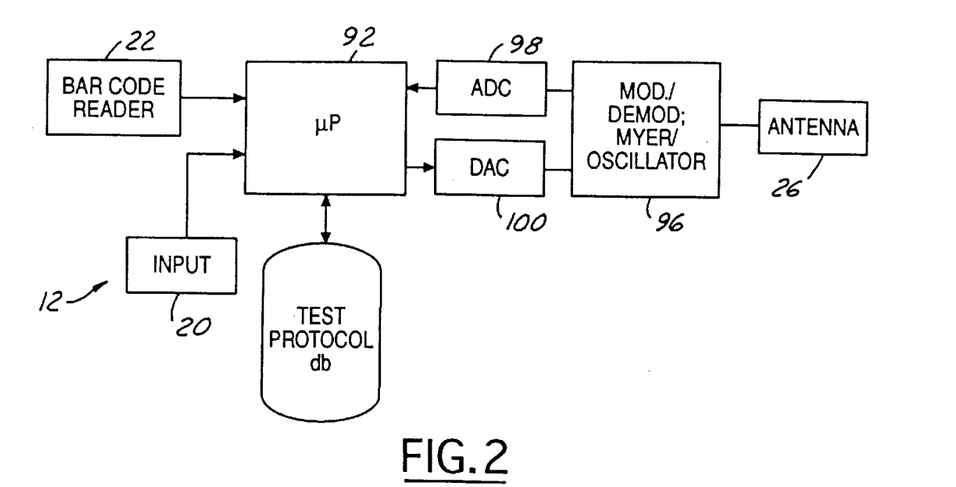
FIG. 2 is a block diagram of the hand held tester.

Now referring to FIG. 2, the tester 12 includes a microprocessor 92. The microprocessor 92 can be a 486 or Pentium® microprocessor or other suitable computing device. As shown, the microprocessor 92 receives data from the bar code reader 22 and the keyboard 20.

Also, the microprocessor 92 accesses a test protocol database 94, which, like the other components of the tester 12, is contained in the tester housing 16 (FIG. 1). In accordance with present principles, the microprocessor 92 with test protocol database 94 includes data and Boolean logic circuits for generating test protocols for vehicles, based on salescode data that is received by the microprocessor 92 from the system computer 66. In other words, based on the type of equipment that a particular vehicle has, as indicated by the salescode data, the microprocessor 92 determines what tests must be executed on the vehicle, to assure electrical system quality. This correlating of salescode data to test protocols is undertaken in accordance with Boolean means known in the art.

FIG. 2 also shows that the microprocessor 92 is electrically connected to an RF tester transceiver 96 and thence to the tester antenna 26. The tester transceiver 96 is an RF transceiver that includes a modulator/demodulator (for modulating and demodulating transmitted and received signals, respectively) and a mixer/oscillator.

When signals are received by the tester 12, they are sent from the tester transceiver 96 to an analog to digital converter (ADC) 98, and then to the microprocessor 92. On the other hand, when signals from the microprocessor 92 are to be transmitted, they are processed by a digital to analog converter (DAC) 100, and then sent to the tester transceiver 96 for transmission.

Figure 3:
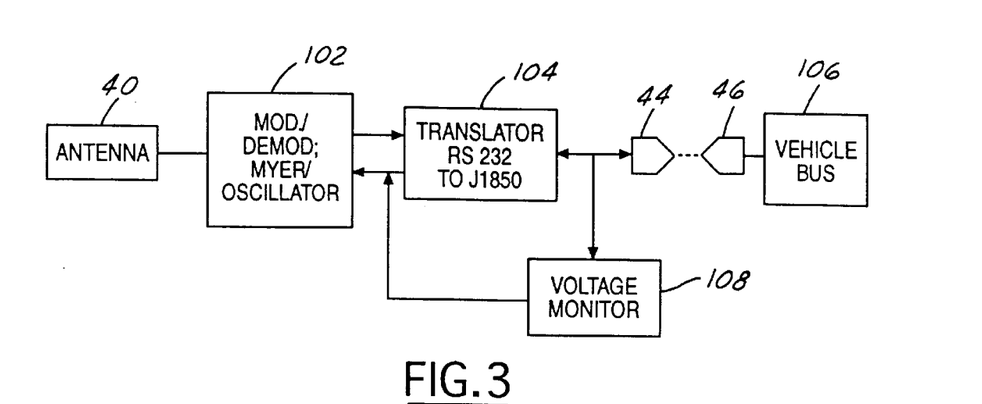
FIG. 3 is a block diagram of the translator.

Now referring to FIG. 3, the electrical components within the translator housing 34 can be seen. As shown, the translator 14 includes a communicator, such as an RF translator transceiver 102, that is electrically connected to the translator antenna 40. Also, the translator transceiver 102 is electrically connected to a translator unit 104, and the translator unit 104 in turn can be electrically connected via the test plug 44 and test receptacle 46 to a communication bus 106 of the electrical system of the vehicle 48 (FIG. 1).

Per the present invention, the translator unit 104 translates data between the tester microprocessor 92 communication protocol and the bus 106 protocol. Thus, test protocol queries from the microprocessor 92 are translated into vehicle bus 106 format by the translator unit 104, to cause the electronic components of the vehicle to respond appropriately, i.e., to respond as commanded by the test protocol. These responses are translated back to microprocessor 92 format by the translator unit 104 and compared by the microprocessor 92 to test setpoints, to determine whether the vehicle 48 has passed the test.

In one embodiment, the translator unit 104 is implemented by electrical circuitry that translates RS-232 formatted data (i.e., serialized data in a computer protocol form) into J1850 vehicle bus formatted data (i.e., data in a protocol form that can be understood by circuitry in the vehicle 48), and vice-versa, in accordance with principles well-known in the art. It is to be understood that the translator unit 104 can be configured for cooperating with vehicle bus formats other than J1850, as appropriate for the particular vehicle model being tested. It is to be further understood that appropriate ADC and DAC can be used as appropriate.

In addition to the above-described translating function, the translator 14 includes a voltage monitor or sensor 108 that is electrically connected to the test plug 44 and translator transceiver 102 as shown. The voltage monitor or sensor 108 generates a signal representative of the voltage on the bus 106, and this signal is transmitted to the microprocessor 92 in the tester 12. The voltage can be used to monitor whether satisfactory communication and testing has been accomplished on the vehicle 48. In other words, the value of the voltage of the bus 106, as indicated by the voltage monitor or sensor 108 and transmitted to the tester 12 by the translator transceiver 102, indicates whether satisfactory communication is being conducted between the bus 106 and the translator 14.

Figure 4:
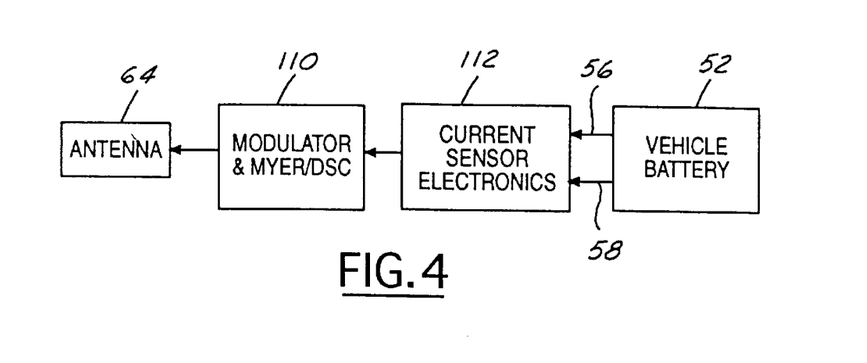
FIG. 4 is a block diagram of the current monitor.

Now referring to FIG. 4, the internal electronics of the current monitor 50 can be seen. As shown, the current monitor 50 includes an RF monitor transceiver 110 that is electrically connected to the monitor antenna 64. A current sensor 112 with associated electronics is electrically connected to the monitor transceiver 110, and the current sensor 112 is connected via the leads 56, 58 to the vehicle battery 52. As intended by the present invention, the current sensor 112 can be a Hall effect sensor or other suitable current sensing device for outputting a signal representative of the current being drawn from the battery 52 during testing. This signal is transmitted to the tester 12 as mentioned previously, so that the microprocessor 92 can determine whether excessive current is being drawn from the battery 52 when, e.g., electric windows of the vehicle 48 are being cycled during testing.

FIG. 5 shows the overall process flow of the present invention, using the structure described above. Commencing at block 114, the VIN of a vehicle to be tested, e.g., the vehicle 48, is scanned into the microprocessor 92 by passing the bar code reader 22 physically close to the bar-coded VIN, as it is displayed on the vehicle 48. Or, the VIN can be manually input into the microprocessor 92 by means of the keyboard 20.

Next, at block 116, the microprocessor 92 of the tester 12 causes the tester transceiver 96 to transmit the VIN via the repeater transceivers 72 and central transceivers 74 to the system computer 66. In response, the system computer 66 access the databases 80, 84 as appropriate to retrieve salescode data for the vehicle 48, based on the VIN. This salescode data is transmitted from the system computer 66 back to the tester 12 via the above-described RF system at block 118.

Moving to block 120, the salescode data is correlated to a test protocol by the microprocessor 92 of the tester 12, as described above. Next, at block 122 a technician engages the test plug 44 of the translator 14 with the test receptacle 46 of the vehicle 48.

It is to be understood that owing to the portability of the tester 12 and translator 14, instead of engaging the test plug 44 with a test receptacle of a vehicle, the test plug 44 can be engaged with a test receptacle of a prototype version of a vehicle electrical system. Such a prototype is commonly referred to as a "wiring buck". Stated differently, the present invention advantageously affords the opportunity to execute the same diagnostic tests on a prototype version of a vehicle electrical system as will be executed on production versions of the vehicle in an assembly plant. In this way, systemic errors in a vehicle model electrical system can be identified and corrected relatively easily, before the system is implemented in production vehicles. Thus, the present steps can be conducted both on production vehicles in assembly plants, and on wiring bucks. For succinctness, however, the remaining discussion will focus on production vehicles, and more particularly the vehicle 48 shown in FIG. 1.

After engaging the translator 14 with the vehicle 48, at block 124 the test protocol generated by the microprocessor 12 is executed by transmitting the test protocol from the tester 12 to the translator 14, translating it to vehicle bus 106 format, and causing the vehicle 48 to undertake the tests. As indicated in FIG. 5, the vehicle 48 permits test execution preferably only when an electronic "handshake" between the translator 14 and vehicle 48 is successful, i.e., only when the translator 14 first transmits an electronic key to unlock the vehicle bus 106. With this cooperation of structure, unauthorized post-assembly testing is prevented.

Recall that the translator 14 monitors the voltage of the vehicle bus 106 during testing and transmits a signal representative of this voltage to the tester 12. Proceeding to decision diamond 126, the microprocessor 92 of the tester 12 determines whether the voltage of the vehicle bus 106 as indicated by the translator 14 is satisfactory. If it is not, a communication error is indicated, and the microprocessor 92 accordingly returns "communication error" at block 128. Then, the microprocessor 92 logic moves to block 130 to transmit this determination to the system computer 66.

If, on the other hand, it is determined at decision diamond 126 that the voltage of the vehicle bus 106 is satisfactory, indicating satisfactory communication between the translator 14 and the bus 106, the microprocessor 92 logic proceeds to decision diamond 132, to determine whether the current being drawn from the battery 52 of the vehicle 48 is satisfactory, as indicated by the signal transmitted to the tester 12 by the current monitor 50. If the battery current is not satisfactory, the microprocessor 92 of the tester 12 moves to block 134 to return "battery current unsatisfactory", and thence to block 130.

Otherwise, the logic of the microprocessor 92 proceeds to decision diamond 136 to determine whether all test results, as transmitted to the tester 12 from the translator 14, are satisfactory. If any tests have failed, the microprocessor 92 logic proceeds to block 138 to return the numbers or other designations of the tests that have failed. In contrast, if no tests have failed, a message indicating "no failures" is returned at block 140. From block 138 or block 140, the process moves to block 130 to transmit the returned results to the system computer 66.

At block 142, the system computer 142 logs the test results by VIN and outputs the results. The output can be hard copy, computer readable file, video display, or other suitable form. The next vehicle to be tested is accessed at block 144, with the process then returning to block 114 to undertake testing on the next vehicle.

FIG. 6 shows details of the software that is executed by the microprocessor 92 of the tester 12 and/or the system computer 66 in the assembly plant 68. Commencing at block 146, an operator of the system computer 66, using an input device such as a mouse or keyboard, defines and/or modifies setpoints for responses to the various tests in a test protocol.

For example, the setpoints for time for window cycle in an electric window test can be established at block 146. And, voltage and current setpoints for various responses can be established at block 146.

In any case, the test protocol setpoints of the present invention can be easily established or changed on site as necessary by modifying the software-implemented setpoints using the input device 88, in contrast to existing electrical test equipment in which test setpoints are hard wired into the test equipment. After establishing test setpoints, if any, the new setpoints are transmitted to the testers of the present invention, e.g., to the tester 12 shown in FIG. 1. In response, the testers update their local test protocol databases, e.g., the test protocol database 94 shown in FIG. 2, as appropriate to reflect the new setpoints.

Proceeding to block 148, an operator of the tester 12 initializes the tester 12 by defining whether certain features are enabled. For example, at block 148 an operator can define whether an "operator ID" variable is enabled, and whether an "abort test on failure of critical test" is enabled. Also, the operator can define whether an immediate retest upon failure of a test is to be enabled.

Additionally, the present invention contemplates that in the event that a tester 12 unsuccessfully attempts to transmit data to the system computer 66, the tester 12 will attempt, at intervals defined at block 148, to retransmit the data. Furthermore, the operator may specify the periodicities at which old data is deleted from the tester 12, and the period of storage for data which has not been transmitted to the system computer 66. Moreover, the operator can specify the content of the reports sent by the tester 12 to the system computer 66, e.g., report only failures, report all results, etc.

After initialization of the tester 12, the process continues to block 150, at which the VIN is input to the tester 12 as described above. Moving to decision diamond 152, the microprocessor 92 of the tester 12 determines whether a variable "Get_Operator_ID" has been enabled at block 148. If so, the tester 12 presents a prompt on the display 18 for the operator's identification. At decision diamond 156 it is determined whether the operator input a valid identification in response to the prompt, and if not, the process ends at error state 158. Otherwise, if the operator identification is valid, or, from decision diamond 152 is the test there was negative, the process moves to block 160 to present on the display 18 the VIN of the vehicle under test, a track sequence number, model type, and, after receiving the salescode data from the system computer 66 as described above, the salescode data of the vehicle under test.

At block 162, the system computer 66 can transmit special test instructions to the tester 12, if desired. For example, the system computer 66 can instruct the tester 12 to execute only those tests that the particular vehicle might have previously failed. Or, the tester 12 can be instructed to execute all tests, as for a previously untested vehicle. In any case, as the test protocol is executed via the translator 14, the test status is updated on the display 18.

During the testing, the microprocessor 92 can move to decision diamond 164 to determine whether a test that has been predesignated as "critical" has failed. If no critical test has failed, the process moves to block 166 to transmit the test results to the system computer 66. On the other hand, if the microprocessor 92 determines at decision diamond 164 that a critical test has failed, the logic of the microprocessor 92 moves to decision diamond 168 to determine whether a variable "Abort_Test" has been enabled.

If the variable "Abort_Test" has not been enabled, indicating that testing should continue despite the failure of a critical test, the process continues executing the test protocol and the results are reported at block 166. If, however, "Abort_Test" has been enabled, the logic moves to block 170 to abort the test, and thence to block 166.

FIG. 6 shows that after the test results have been transmitted by the tester 12 to the system computer 66 at block 166, the logic moves to decision diamond 172 to determine whether the test results were successfully transmitted, as might be indicated by, e.g., a checksum acknowledgement from the system computer 66. If the transmission was unsuccessful, according to the determination at decision diamond 172, the tester 12 saves the untransmitted data at block 174, and retransmissions are attempted at the periodicity define at block 148.

From block 174, or from decision diamond 172 if it was determined that the data was successfully transmitted to the system computer 66, the process moves to decision diamond 176 to determine whether the vehicle failed any tests in the test protocol. If not, the logic returns to block 150 to test the next vehicle.

If, however, it is determined at decision diamond 176 that the vehicle under test failed one or more tests in the protocol, the logic moves to decision diamond 178 to determine whether the operator enabled automatic execution of retests at block 148. If so, the logic immediately executes a retest of the failed tests at block 180. From block 180, or from decision diamond 178 of the results of the decision were negative, the logic returns to block 150 to await the next VIN.

While the particular METHOD FOR TESTING VEHICLE ELECTRICAL SYSTEM DURING MANUFACTURING as herein disclosed and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims.

We claim:

1. A method of testing an electrical system of a vehicle at a vehicle assembly plant, wherein the vehicle includes a battery, comprising the steps of:

transmitting, via a radiofrequency (RF) link, vehicle information to a portable tester;

testing the electrical system in accordance with the vehicle information;

monitoring the current from the battery during testing; and monitoring the voltage of the electrical system during testing.

2. The method of claim 1, wherein the vehicle identification is salescode information, and the method further comprises:

transmitting, at the portable tester, a vehicle information number (VIN) associated with the vehicle to cause the transmitting of the salescode date in response.

3. The method of claim 2, wherein the VIN is input by scanning the VIN into the tester.

4. The method of claim 2, further comprising the step of correlating the salescode date to test protocols at the tester.

5. The method of claim 4, further comprising the steps of:

engaging a translator with a test receptacle of the electrical system; and establishing communication between the translator and the tester.

6. The method of claim 5, wherein communication is established between the translator and the tester by an RF link.

7. A method of testing an electrical system of a vehicle at a vehicle assembly plant, comprising the steps of:

transmitting, via a radiofrequency (RF) link, vehicle information to a portable tester;

establishing communication between the tester and the electrical system only when the tester transmits a predetermined key code to the electrical system; and testing the electrical system in accordance with the vehicle information.

8. The method of claim 7, wherein the vehicle identification is salescode information, and the method further comprises:

transmitting, at the portable tester, a vehicle information number (VIN) associated with the vehicle to cause the transmitting of the salescode date in response.

9. The method of claim 8, further comprising the step of correlating the salescode data to test protocols at the tester.

10. The method of claim 9, further comprising the steps of:

engaging a translator with a test receptacle of the electrical system; and establishing communication between the translator and the tester.

11. The method of claim 10, wherein communication is established between the translator and the tester by an RF link.

12. The method of claim 8, wherein the VIN is input by scanning the VIN into the tester.

13. A method for testing electrical components of a vehicle during assembly of the vehicle or thereafter in substantially any location within or immediately adjacent to a vehicle assembly plant, wherein the vehicle includes a battery, comprising the steps of:

obtaining a VIN associated with the vehicle by scanning the VIN using a bar code reader;

transmitting the VIN via a primary RF link to a computer;

in response to receiving the VIN, transmitting salescode date;

correlating the salescode date to a test protocol;

executing the test protocol to test the electrical components of the vehicle;

engaging a translator with a test receptacle of the vehicle;

establishing communication between the translator and an electrical tester in communication with the system computer via the primary RF link;

monitoring the current from the battery during testing; and monitoring the voltage of the electrical system during testing.

14. The method of claim 13, wherein communication is established between the translator and the tester via a secondary RF link.

15. A method for testing electrical components of a vehicle during assembly of the vehicle or thereafter in substantially any location within or immediately adjacent to a vehicle assembly plant, comprising the step of:

obtaining a VIN associated with the vehicle by scanning the VIN using a bar code reader;

transmitting the VIN via a primary RF link to a computer;

in response to receiving the VIN, transmitting salescode date;

correlating the salescode date to a test protocol;

executing the test protocol to test the electrical components of the vehicle;

engaging a translator with a test receptacle of the vehicle;

establishing communication between the translator and an electrical tester in communication with the system computer via the primary RF link; and establishing communication between the tester and the electrical system only when the tester transmits a predetermined key code to the electrical system.

16. The method of claim 15, wherein communication is established between the translator and the tester via a secondary RF link.

17. A method for testing an electrical system of a vehicle during assembly of the vehicle or thereafter in substantially any location within or immediately adjacent to a vehicle assembly plant, comprising the steps of:

transmitting, at a portable tester, a vehicle identification number (VIN) associated with the vehicle;

transmitting, via a radiofrequency (RF) link, salescode date to the tester in response to the VIN;

correlating the salescode data to test protocols at the tester;

testing the electrical system in accordance with the test protocols; and establishing communication between the tester and the electrical system only when the tester transmits a predetermined key code to the electrical system.

18. The method of claim 17, further comprising the steps of:

engaging a translator with a test receptacle of the electrical system; and establishing communication between the translator and the tester.

19. The method of claim 18, wherein communication is established between the translator and the tester by an RF link.

20. The method of claim 17, wherein the VIN is input to the tester by scanning the VIN into the tester.

21. A method for testing an electrical system of a vehicle during assembly of the vehicle or thereafter in substantially any location within or immediately adjacent to a vehicle assembly plant, wherein the vehicle includes a battery, comprising the steps of:

transmitting, at a portable tester, a vehicle identification number (VIN) associated with the vehicle;

transmitting, via a radiofreguency (RF) link, salescode date to the tester in response to the VIN;

correlating the salescode data to test protocols at the tester;

testing the electrical system in accordance with the test protocols;

monitoring the current from the battery during testing; and monitoring the voltage of the electrical system during testing.

22. The method of claim 21, wherein the VIN is input to the tester by scanning the VIN into the tester.

23. The method of claim 21, further comprising the steps of:

engaging a translator with a test receptacle of the electrical system; and establishing communication between the translator and the tester.

24. The method of claims 23 wherein communication is established between the translator and the tester by an RF link.

* * * * *